(12) United States Patent
Sinha et al.

(10) Patent No.: US 7,749,327 B2
(45) Date of Patent: Jul. 6, 2010

(54) METHODS FOR TREATING SURFACES

(75) Inventors: Nishant Sinha, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 259 days.

(21) Appl. No.: 11/933,770

(22) Filed: Nov. 1, 2007

(65) Prior Publication Data
US 2009/0114246 A1 May 7, 2009

(51) Int. Cl.
B08B 3/00 (2006.01)
B08B 3/04 (2006.01)
(52) U.S. Cl. ............................................. 134/7; 134/34
(58) Field of Classification Search ...................... 134/7, 134/26
See application file for complete search history.

(56) References Cited

U.S. PATENT DOCUMENTS

| | | | |
|---|---|---|---|
| 5,372,652 A * | 12/1994 | Srikrishnan et al. ............. | 134/7 |
| 5,796,111 A | 8/1998 | Mahoney | |
| 6,033,484 A | 3/2000 | Mahoney | |
| 6,036,785 A * | 3/2000 | Ferrell ........................... | 134/1 |
| 6,205,676 B1 | 3/2001 | Fujii et al. | |
| 6,517,636 B1 * | 2/2003 | Verhaverbeke ................. | 134/2 |
| 6,696,228 B2 | 2/2004 | Muraoka et al. | |
| 6,799,584 B2 | 10/2004 | Yogev et al. | |
| 7,094,448 B2 | 8/2006 | Ono et al. | |
| 2006/0118132 A1* | 6/2006 | Bergman et al. ................ | 134/1 |
| 2006/0128600 A1* | 6/2006 | Freer et al. ................... | 510/491 |
| 2007/0023907 A1 | 2/2007 | Fork et al. | |
| 2008/0196742 A1* | 8/2008 | Beck .......................... | 134/1.3 |

FOREIGN PATENT DOCUMENTS

WO WO 2006/106045 * 10/2006

OTHER PUBLICATIONS

Zhang, Fan, et al. "The Removal of Deformed Submicron Particles from Silicon Wafers" Journal of Electronic Materials, Feb. 2000 pp. 1-22.
Ziskind, G., et al. "Experimental Investigation of Particle Removal from Surfaces by Pulsed Air Jets" Aerosol Science and Technology 36: 652-659 (2002).
Hill, Elizabeth A. "Carbon Dioxide Snow Examination and Experimentation" "Precision Cleaning—The Magazine of Critical Cleaning Technology" Parts Cleaning pp. 1-6 © 1999.
Oeftering, Richard C. "Manipulating Liquids With Acoustic Radiation Pressure" Article http://www.grc.nasa.gov/WWW/RT1996/4000/4120o.htm 3 pages last printed Sep. 1, 2007.

* cited by examiner

Primary Examiner—Michael Kornakov
Assistant Examiner—Natasha Campbell
(74) Attorney, Agent, or Firm—Wells St. John P.S.

(57) ABSTRACT

Some embodiments include methods for treating surfaces. Beads and/or other insolubles may be dispersed within a liquid carrier to form a dispersion. A transfer layer may be formed across a surface. The dispersion may be directed toward the transfer layer, and the insolubles may impact the transfer layer. The impacting may generate force in the transfer layer, and such force may be transferred through the transfer layer to the surface. The surface may be a surface of a semiconductor substrate, and the force may be utilized to sweep contaminants from the semiconductor substrate surface. The transfer layer may be a liquid, and in some embodiments may be a cleaning solution.

2 Claims, 4 Drawing Sheets

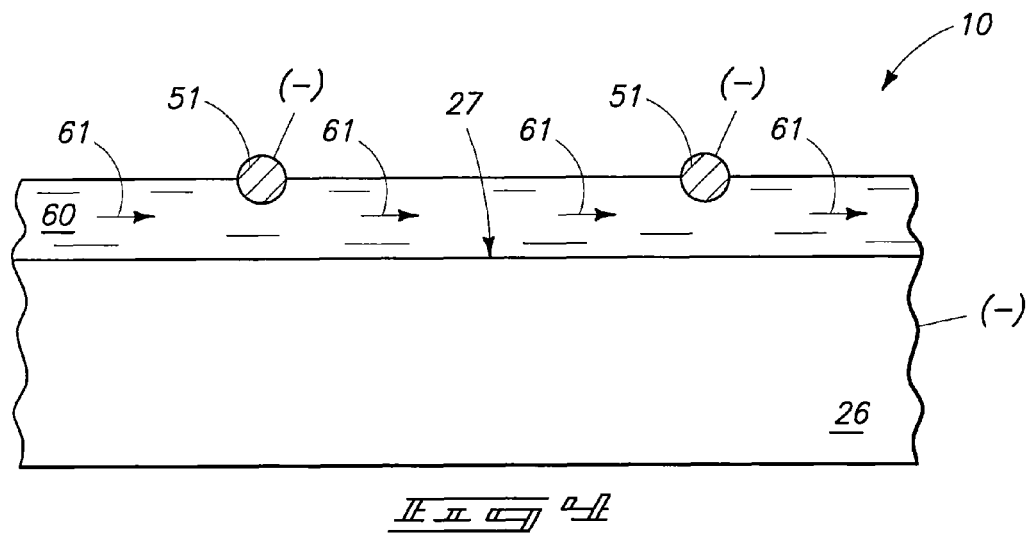
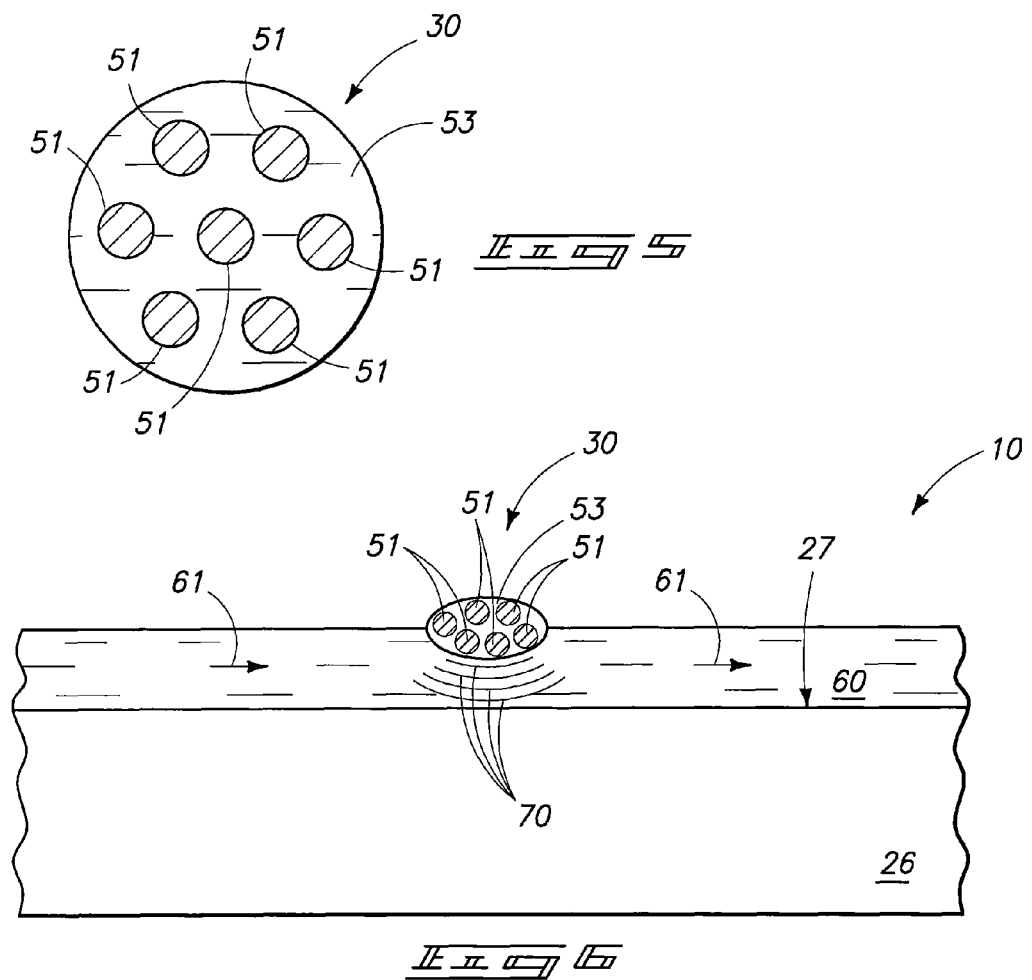

METHODS FOR TREATING SURFACES

TECHNICAL FIELD

Methods for treating surfaces, such as, for example, semiconductor substrate surfaces.

BACKGROUND

It is frequently desired to remove materials from over substrate surfaces. For instance, semiconductor fabrication may involve removal of contaminant particulates from over a semiconductor substrate surface, and/or stripping of sacrificial materials from over a semiconductor substrate surface. The terms "semiconductive substrate," "semiconductor construction" and "semiconductor substrate" mean any construction comprising semiconductive material (for instance, silicon and/or germanium), including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above.

Numerous cleaning solutions and chemistries have been developed for removing materials from over semiconductor substrate surfaces. The cleaning solutions may, for example, comprise deionized water; either alone, or in combination with one or more of sulfuric acid, hydrochloric acid, hydrofluoric acid, ammonium hydroxide, hydrogen peroxide, etc. Accordingly, cleaning solutions may be acidic, basic, or of neutral pH, depending on the application.

Some materials are fairly easy to clean from over semiconductor substrates, in that the materials are chemically much different than the underlying surface of the semiconductor substrate. However, other materials can be difficult to remove selectively relative to an underlying surface of a semiconductor substrate in that the materials may be of the same composition, or of a similar composition, as one or more regions of the surface of the semiconductor substrate. Materials that can be particularly difficult to remove in some applications are silicon, silicon dioxide, silicon nitride, and polymeric organic materials.

A method being developed for removal of materials (for instance, particulates of varying size and shape) is to utilize liquid aerosol droplets to impact a surface of a semiconductor substrate and dislodge undesired materials from such surface. The liquid aerosol droplets may dislodge the materials by physical interaction (analogous to bead-blasting), chemical interaction (in other words, reaction with the materials to convert them to a form more readily dislodged than an initial form), or a combination of physical interactions and chemical interactions. In some applications, the liquid aerosol droplets may be charged so that they have a polarity (either positive or negative), and the liquid aerosol droplets may impart such polarity to the undesired materials on the substrate surface. The substrate may be charged to the same polarity as that imparted to the undesired materials so that electrostatic repulsion occurs between the substrate surface and the undesired materials to assist in dislodging such materials from the surface.

The liquid aerosol droplets may be directed toward a substrate surface via any suitable method, including, for example, spraying (fluid force propulsion), gas jet, electrical repulsive forces, etc.

Although aerosols have potential for utilization in cleaning various substrates, such as semiconductor substrates, they currently have limited application. It is desired to develop improved methods for cleaning substrates, such as semiconductor substrates, which improve applicability for utilization of aerosols in diverse applications.

BRIEF DESCRIPTION OF THE DRAWINGS

FIG. 4 shows a diagrammatic view of a portion of the apparatus of FIG. 1 at a processing stage for treating a substrate surface in accordance with an embodiment.

FIG. 5 shows a diagrammatic view of an aerosol droplet in accordance with an embodiment.

FIG. 6 shows a diagrammatic view of a portion of the apparatus of FIG. 1 at a processing stage for treating a substrate surface in accordance with an embodiment utilizing the aerosol droplet of FIG. 5.

DETAILED DESCRIPTION OF THE ILLUSTRATED EMBODIMENTS

Some embodiments include methods in which insolubles are utilized for treating surfaces, such as, for example, semiconductor substrate surfaces. The insolubles may be solid, and may comprise organic or inorganic compositions. Example organic compositions are polystyrene, polyvinyltoluene, polymethylmethacrylate, and styrene/vinyltoluene copolymer; and example inorganic compositions are silicon dioxide and aluminum oxide.

The insolubles may be provided in a dispersion with liquid carrier, and then the dispersion may be broadcast as aerosol droplets. The aerosol droplets may then be directed toward the surface which is to be treated.

In some embodiments, a liquid cushion is over the surface, and the aerosol droplets impact the liquid cushion to generate forces that are transferred through the liquid cushion to the surface. Such forces may be used to sweep particles off from the surface.

In some embodiments, the liquid carrier of the aerosol droplets evaporates as the droplets travel to the liquid cushion so that it is primarily the insolubles from the dispersion that reach the liquid cushion.

The liquid cushion may consist of a composition that is chemically inert relative to materials along the surface, or may comprise a cleaning solution or other solution containing one or more compositions that may react with one or more materials along the treated surface. The insolubles from the dispersion may remain insoluble in the liquid cushion, or in some embodiments may dissolve in the liquid cushion after impacting the liquid cushion.

The aerosol droplets may be formed by passing liquid to an aerosol generator. The aerosol generator may be an aerosolizing (or atomizing) nozzle or spray head, such as, for example, an electrostatic nozzle, a piezoelectric nozzle, an ultrasonic or megasonic nozzle (with ultrasonic and megasonic nozzles being examples of acoustic nozzles), or an electrohydrodynamic atomization nozzle. The term "aerosol droplet" means a smallest separate unit of an aerosol, and may also be referred to as an aerosol particle. The aerosol droplets may have a volume of less than three picoliters; and may have a mean size distribution of less than 10 microns, and in some applications may have a mean size distribution of less than 100 nanometers.

Example embodiments are described below with reference to FIGS. 1-7.

Figure 1:
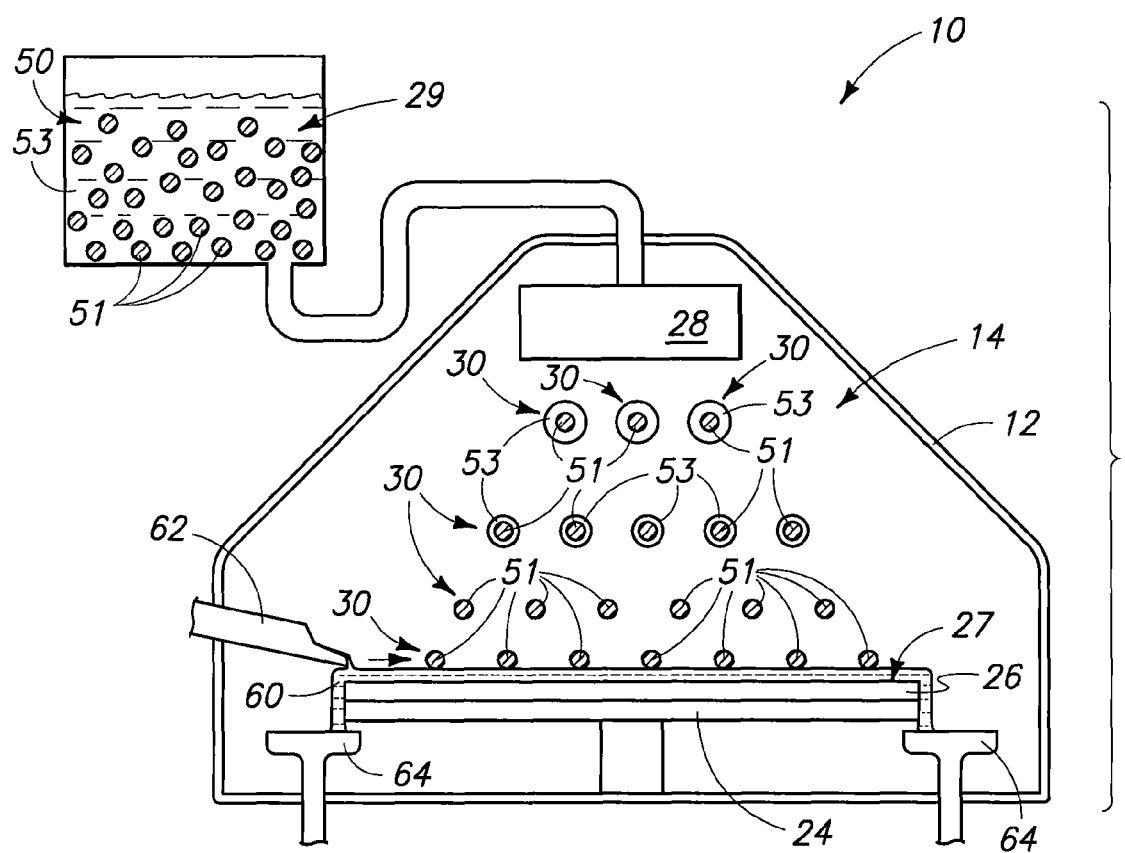
FIG. 1 is a diagrammatic view of an apparatus utilized for treating a substrate surface in accordance with an example embodiment.

Referring to FIG. 1, such illustrates an example apparatus 10 which may be utilized in some embodiments. The apparatus includes a sidewall 12 that extends around a reaction chamber 14.

A substrate holder 24 is within the chamber, and such retains a substrate 26. The substrate holder may be configured to retain specific types of substrates. In some embodiments, the substrate 26 may correspond to a semiconductor substrate, and the substrate holder may be configured to retain the semiconductor substrate (for instance, the substrate holder may have a recess with a size and shape complementary to the semiconductor substrate). The substrate 26 has an upper surface 27.

An aerosol-forming nozzle 28 is within the chamber, and in fluid connection with a reservoir 29. The reservoir contains a dispersion 50 comprising insolubles 51 (only some of which are labeled) dispersed in a liquid 53. The insolubles 51 may be referred to as structures 51 in the discussion that follows. The liquid 53 may be referred to as a carrier liquid, in that it carries the insolubles 51 to aerosol-forming nozzle 28.

The insolubles 51 may be solid or semi-solid (for instance, gelatinous); and in some embodiments may correspond to beads of organic or inorganic material. Example organic materials are organic polymers; such as, for example, one or more materials selected from the group consisting of polystyrene, polyvinyltoluene, polymethylmethacrylate, and styrene/vinyltoluene copolymer. Example inorganic compositions are silicon dioxide and aluminum oxide; and in some embodiments the insolubles may comprise, consist essentially or, or consist of one or both of silicon dioxide and aluminum oxide.

The dispersion 50 may be formed by dispersing insolubles 51 within liquid 53 to a desired concentration of the insolubles. In some embodiments, the dispersion may comprise from about 0.1 volume % to about 90 volume % insolubles. In some embodiments, the insolubles 51 may be kept suspended within dispersion 50 with a mixer (not shown) provided in the reservoir. In other embodiments, the insolubles 51 may be a colloidal suspension within the liquid 53 and remain suspended without ongoing mixing.

The insolubles 51 may have any suitable size, and in some embodiments may have maximal cross-sectional dimensions of from about 1 micrometer to about 25 micrometers; and may, for example, have maximal cross-sectional dimensions of from about 1 micrometer to about 10 micrometers.

In operation, dispersion 50 is passed from reservoir 29 to nozzle 28, whereupon it is atomized. The atomized dispersion is then broadcast into the chamber as aerosol droplets (diagrammatically illustrated as aerosol droplets 30, only some of which are labeled). The aerosol-forming nozzle may be comprised by any suitable aerosol generator, and may, for example, correspond to an electrostatic nozzle, a piezoelectric nozzle, an ultrasonic or megasonic nozzle, or an electrohydrodynamic atomization nozzle.

The droplets 30 may comprise a size only slightly bigger than individual insolubles 51 so that each droplet is formed to comprise a single insoluble 51 and a liquid carrier shell around the insoluble, as shown. For instance, the insolubles may be beads having a maximal cross-sectional size of from about 1 micrometer to less than 10 micrometers, and the droplets 30 may have a volume less than or equal to about 100% greater than the volume of the beads. In some embodiments, the beads will be substantially uniform in size and shape, and the droplets will also be substantially uniform in size and shape so that the vast majority (in other words, greater than 99%) of the droplets contain the same number of beads as one another.

In the shown embodiment, the droplets are shown to each comprise a single insoluble 51 that is represented as a bead within the droplet. In other embodiments the individual droplets may comprise multiple discrete insolubles, as discussed below with reference to FIGS. 5 and 6.

Although nozzle 28 is shown within chamber 14, in other embodiments the nozzle may be external of the chamber so that aerosol droplets are formed outside of the chamber, and then passed through an opening in the chamber sidewall to enter the chamber. In any event, nozzle 28 will be proximate the chamber so that aerosol droplets formed by the nozzle may be directed toward the substrate 26 retained within the chamber.

A fluid 60 is shown flowed across the upper surface 27 of substrate 26. Specifically, fluid 60 is shown flowing from a tube 62, across the surface 27, and into catch basins 64. The fluid 60 forms a cushion across surface 27 to protect surface 27 from direct impact of aerosol droplets 30. Fluid 60 may comprise a liquid formed in a layer thin enough so that force generated by impact of droplets 30 is transferred through the liquid layer and to the upper surface 27 of substrate 26.

In embodiments in which force is transferred through a material (such as fluid 60) to the upper surface of substrate 26, such material may be referred to as a transfer layer. In some embodiments, the transfer layer may be a free-flowing low-viscosity fluid or liquid (as shown); and in other embodiments the transfer layer may be highly viscous, such as spin-on material.

In embodiments in which fluid 60 comprises a liquid, the fluid 60 may be referred to as a second liquid, and the carrier liquid 53 may be referred to as a first liquid to distinguish the liquids from one another.

The fluid 60 may comprise any suitable fluid. In some embodiments, fluid 60 may be chemically inert relative to reaction with materials along the upper surface 27 of substrate 26. For instance, the fluid 60 may consist of deionized water. In some embodiments, fluid 60 may comprise one or more compositions suitable for reacting with materials that may be present along the upper surface 27 of substrate 26. For instance, if the substrate corresponds to a semiconductor substrate, fluid 60 may comprise a traditional cleaning liquid utilized for cleaning a semiconductor substrate surface; and may, for example, comprise, consist essentially of, or consist of deionized water in combination with one or more of sulfuric acid, hydrochloric acid, hydrofluoric acid, ammonium hydroxide, tetramethyl ammonium hydroxide, hydrogen peroxide, etc. Accordingly, the fluid 60 may be of basic pH, neutral pH, or acidic pH in various embodiments. In some embodiments, fluid 60 may correspond to a cleaning liquid of the type generally referred to as standard clean 1 (SC1). In some embodiments, the fluid 60 may comprise one or more oxidizers (for instance, hydrogen peroxide, ozone, etc.) in addition to, or alternatively to, acid or base. Some acids are also oxidizers, but some of the oxidizers that may be included in addition to the acids may be oxidizers which are not themselves acids.

The aerosol droplets 30 are directed toward substrate 26. Such may be accomplished by fluid-force propulsion through nozzle 28. The propulsion of the aerosol droplets toward the substrate surface may alternatively, or additionally, include blending a gas jet with the fluid stream entering nozzle 28, and utilizing the gas stream to push the aerosol droplets toward the substrate. In some embodiments, the propulsion of the aerosol droplets toward the substrate surface may alternatively, or additionally, include providing electrical charge to the aerosol droplets and to one or more components within the chamber so that the aerosol particles may be electrostatically attracted and/or repelled from various components to direct the aerosol droplets toward the substrate. For instance, focusing rings and/or electrodes of the types described in U.S. patent publication number 2006/0118132 may be utilized to direct the aerosol droplets.

In the shown embodiment, liquid carrier 53 evaporates from droplets 30 as the droplets travel toward fluid 60. Accordingly, the liquid carrier shell becomes increasingly thinner as the droplets get closer to fluid 60, and disappears entirely by the time the droplets reached fluid 60 so that it is only insolubles 51 that impact fluid 60. Such embodiment may utilize highly volatile liquid carrier (for instance, liquid carrier comprising one or more of methanol, ethanol, propanol, butanol, acetone and isopropyl alcohol), in combination with a temperature within reaction chamber 14 that is high enough to completely volatilize the liquid carrier from droplets 30. The temperature may be constant throughout the reaction chamber, or may comprise a temperature gradient that increases in a direction going from nozzle 28 to fluid 60. The temperature within chamber 14 may be controlled by one or more heaters (not shown in FIG. 1).

Although the liquid carrier 53 is shown to be evaporated from droplets 30 during the travel of the droplets from nozzle 28 to fluid 60, in other embodiments at least some of the liquid carrier may remain with the droplets as they impact fluid 60.

Figure 2:
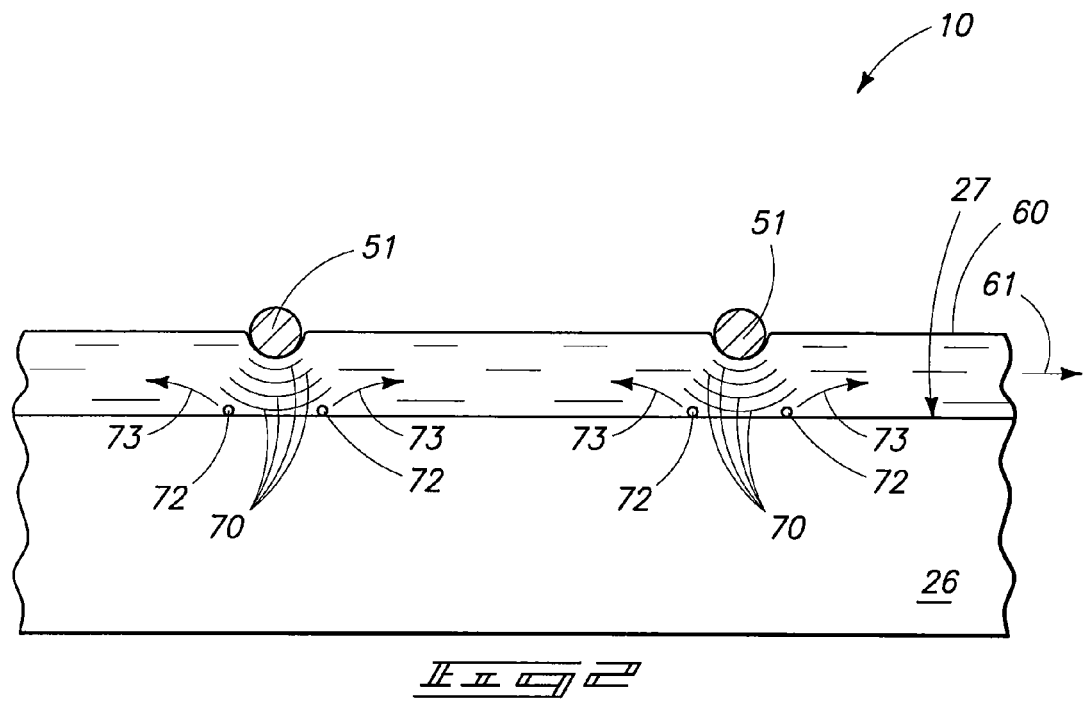
FIG. 2 shows a diagrammatic view of a portion of the apparatus of FIG. 1 at a processing stage for treating a substrate surface in accordance with an embodiment.

The impact of insolubles 51 with fluid 60 may cause force to transfer through the fluid, and such force may be utilized to remove particulates and/or other contaminants from along surface 27, as shown in FIG. 2. More specifically, FIG. 2 shows an expanded region of apparatus 10 illustrating the impact of insolubles 51 with fluid 60, and showing that such impact may generate pressure waves 70 that propagate through fluid 60 to the upper surface 27 of substrate 26. FIG. 2 also shows contaminating particulates 72 along upper surface 27 of substrate 26, and shows the pressure waves 70 sweeping the particulates off from the surface (as represented by arrows 73 showing the movement of the particulates into fluid 60).

The fluid 60 flows along a direction illustrated by arrow 61, and the particulates that are swept into fluid 60 flow with the fluid across and off from surface 27. Accordingly, utilization of insolubles 51 may enhance removal of materials from over surface 27 relative to the utilization of fluid 60 alone. The incorporation of insolubles 51 into aerosol droplets 30 may enable better delivery of force to fluid 60 than would be achieved utilizing the more elastic material of conventional liquid aerosol droplets. Further, the utilization of solid insolubles (for instance, beads) may enable better control of the uniformity of particle size and energy within the droplets than would be achieved utilizing conventional droplets that consist only of liquid.

The flux of insolubles 51 onto fluid 60 may be any suitable flux, and in some embodiments will be from about 50 particles per exposed region of fluid 60 per second to about 350 particles per exposed region of fluid 60 per second. The exposed region of the fluid 60 is the region of the fluid that is within the beam of the broadcast droplets 30. Such exposed region may be the entirety of the fluid over surface 27 in some embodiments, or may be a sub-portion of the fluid in other embodiments, depending on the width of aerosol-forming nozzle 28, the rate of lateral expansion of the beam of droplets broadcast from aerosol-forming nozzle 28, the distance of the aerosol-forming nozzle from fluid 60, etc.

Fluid 60 compressively absorbs some force of the impact of insolubles 51, which can reduce damage to the surface 27 relative to that which may occur if insolubles 51 directly impact surface 27. In some embodiments, it may be desired to crater or otherwise damage a material across surface 27 to enhance removal of the material (for instance if a material is to be stripped from the surface), and in such embodiments fluid 60 may be omitted.

The structures 51 are referred to as "insolubles" due to the insolubility of the structures in carrier liquid 53 (FIG. 1), and the term "insoluble" is not used to imply anything regarding the solubility of structures 51 in fluid 60. The structures may be insoluble in fluid 60 in some embodiments, and may be at least partially soluble in fluid 60 in other embodiments.

Figure 3:
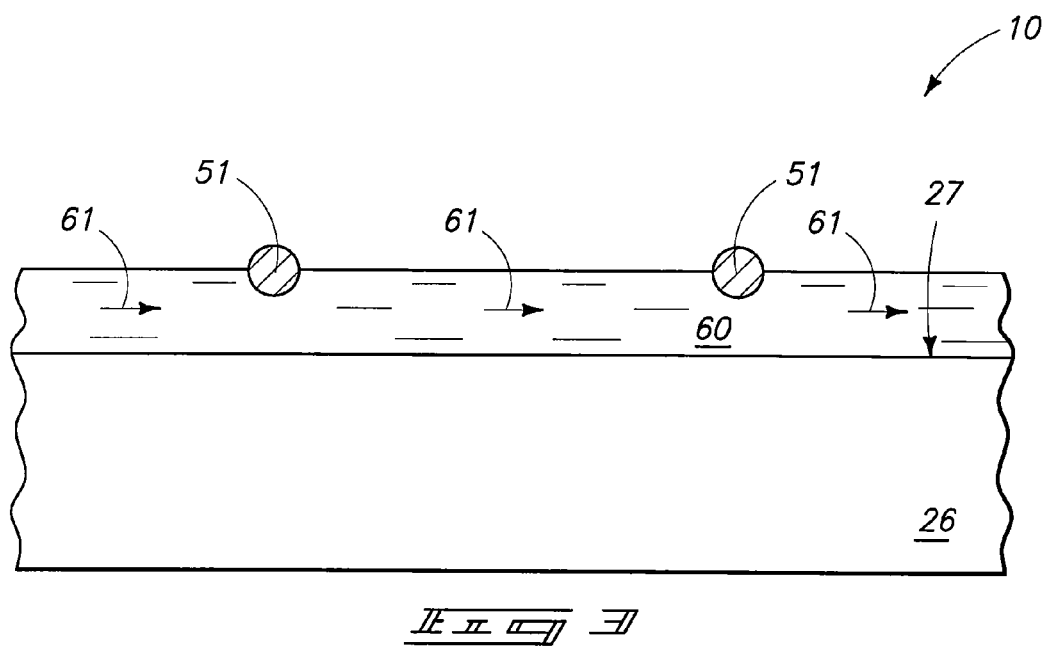
FIG. 3 shows a diagrammatic view of a portion of the apparatus of FIG. 1 at a processing stage for treating a substrate surface in accordance with an embodiment.

In some embodiments, structures 51 are less dense than fluid 60 and at least partially insoluble in the fluid. Accordingly, structures 51 float away on the fluid as shown in FIG. 3. Even if the structures 51 are more dense than the fluid 60, the structures 51 may be swept off of substrate 26 in the flow of the fluid 60 along direction 61. However, if the structure 51 are more dense than the fluid, the structures may abrade surface 27 as they travel across the surface. One method for avoiding such abrasion is to charge structures 51 and substrate 26 to the same polarity as one another so that the substrate electrostatically repels structures 51 from surface 27, as illustrated in FIG. 4 wherein the structures 51 and substrate 26 are both shown charged to a negative polarity.

The charging of the structures 51 and substrate 26 to the same polarity as one another may be beneficial regardless of whether the structures are less dense than fluid 60 in that such charging may prevent the structures from penetrating through fluid 60 to the upper surface 27 of substrate 26.

The charging of structures 51 may be accomplished by any suitable method. In some embodiments, the droplets 30 (FIG. 1) are charged as they are formed so that at least some of the charge polarity of the structures 51 is induced during formation of droplets 30. For instance, if the aerosol-forming nozzle 28 (FIG. 1) is an electrohydrodynamic atomization nozzle, such may be utilized to impart charge polarity to droplets 30 during atomization of the dispersion 50 (FIG. 1). If droplets 30 carry charge polarity, such polarity may remain with structures 51 after evaporation of liquid carrier 53 in the embodiment of FIG. 1. Alternatively, in embodiments in which the liquid carrier does not evaporate, the polarity may remain with the components 51 and 53 of a droplet as it impacts fluid 60, and then the charge may remain with structures 51 after the impacting of the structures with fluid 60.

In some embodiments, insoluble structures 51 are charged by providing charged compositions within liquid 53, and then coupling the charged compositions with the structures 51 during formation of dispersion 50. The coupling may comprise formation of chemical bonds, electrostatic interactions, Van der Waals interactions, etc. In some embodiments the charge may be provided on surfactant within liquid 53, and such surfactant may be coupled to structures 51 to provide charge to the structures so that at least some of the charge polarity of the structures 51 is induced by the surfactant.

The embodiments of FIGS. 3 and 4 may utilize the flow of liquid 60 to sweep all of the structures 51 off of the substrate 26. In other embodiments, some of the structures 51 may remain over substrate 26 either due to the flow of liquid 60 being too slow to sweep all of the structures off of the substrate, or due to liquid 60 being static (in other words, not flowed across a surface as may occur if liquid 60 is highly viscous, such as a spin-on material) so that structures 51 remain over substrate 26 after the utilization of the structures to treat surface 27. In such embodiments, the structures may be removed from over substrate 26 utilizing any suitable method, including, for example, dissolving the structures in a suitable chemical solvent; and/or spray cleaning of surface 27 with gas and/or liquid. Alternatively, or additionally, organic structures may be removed by exposing the structures to oxidant and suitable high temperature to oxidize the structures.

The embodiment of FIG. 1 shows droplets 30 containing single structures 51 encapsulated by carrier liquid 53. Another embodiment is to have multiple structures 51 within a single droplet 30, as is illustrated in FIG. 5. The embodiment of FIG. 5 may be utilized in applications similar to that of FIG. 1 in which the carrier liquid 53 substantially entirely evaporates by the time the structures 51 reach fluid 60. Alternatively, the embodiment of FIG. 5 may be utilized in applications in which the carrier liquid remains with the droplet 30 as the droplet impacts fluid 60, as shown in FIG. 6. In the embodiment of FIG. 6, the droplet 30 collapses upon impact with fluid 60 to cause pressure waves 70 migrating through fluid 60 to upper surface 27 of substrate 26. The carrier liquid 53 may subsequently diffuse into fluid 60, and the structures 51 may subsequently scatter in the fluid 60 to be either swept away by the flow along direction 61 or to be removed by the chemical methods discussed above (for instance, oxidation). The utilization of several insoluble structures in a single droplet enables the droplet to have more mass than would a droplet having only a single insoluble structure (if the multiple insoluble structures are of the same size as the single insoluble structure), which may enable the droplet having multiple insoluble structures to deliver increased impact force relative to a droplet having only a single insoluble structure contained therein.

Figure 7:
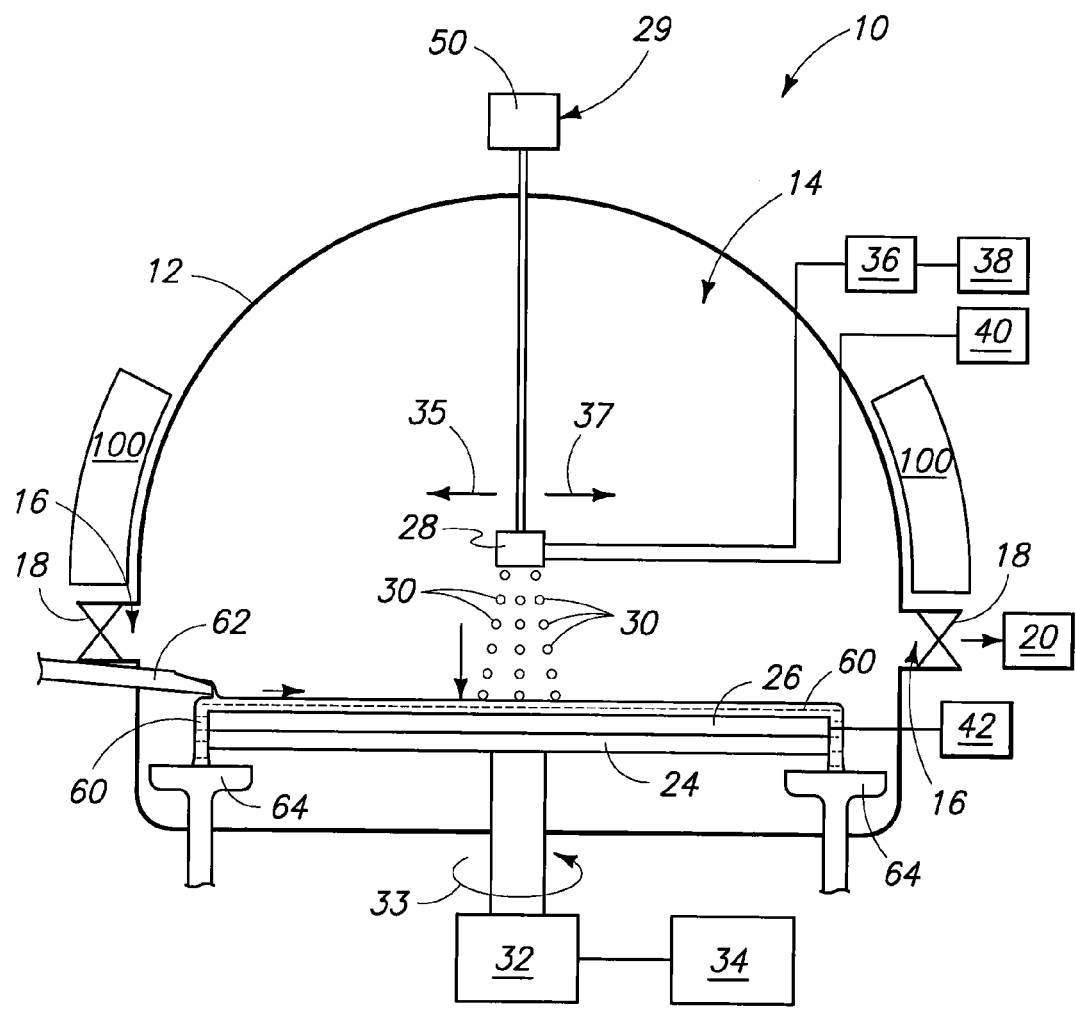
FIG. 7 is a diagrammatic view of an apparatus utilized for treating a substrate surface in accordance with an example embodiment.

FIG. 1 is a simplified diagram of an apparatus that may be utilized in some embodiments. FIG. 7 shows a more detailed illustration of an apparatus that may be used in some embodiments. In referring to FIG. 7, similar numbering will be used as is used to describe the apparatus of FIG. 1.

The apparatus 10 of FIG. 7 includes the sidewall 12 extending around the reaction chamber 14. The apparatus of FIG. 7 also has ports 16 extending through the sidewall to the chamber, and valves 18 regulating flow of materials through the ports. The ports are utilized for inlets and outlets to the chamber. In operation, the valves may be utilized to control flow into and out of the chamber so that desired pressures of materials may be provided within the chamber. One or more of the ports may be in fluid communication with a pump 20, which may be utilized during control of the pressure within the chamber.

Substrate holder 24 is within the chamber, and retains the substrate 26.

Aerosol-forming nozzle 28 is within the chamber, and is in fluid connection with the reservoir 29. The reservoir 29 contains the dispersion 50 (the solid particles 51 are not shown in FIG. 7 due to the scale of the drawing making it difficult to illustrate the particles). The atomized dispersion is shown broadcast into the chamber as aerosol droplets 30 (only some of which are labeled).

The aerosol droplets 30 are directed toward the fluid 60 that is across the upper surface of substrate 26.

In the shown embodiment, nozzle 28 is coupled with a power source 40, and substrate 26 is coupled with a power source 42. The nozzle 28 may be an electrohydrodynamic nozzle powered by source 40. Further, the power source 40 may be utilized to induce a polarity to the aerosol droplets 30.

Power source 42 may induce a polarity onto substrate 26. Such polarity may be the same as that induced on the droplets, as discussed above with reference to FIG. 4.

The aerosol droplets 30 are shown impacting a small region of the upper surface of substrate 26. In some embodiments, it may be desired to treat only specific small regions of the upper surface of the substrate. In other embodiments, it may be desired to uniformly treat an entirety of the upper surface of the substrate. If it is desired to treat the entirety of the upper surface of the substrate, multiple nozzles may be used to create aerosol coverage across the entire surface. Alternatively, or additionally, one or both of the substrate and the aerosol-generating nozzle may be moved during treatment of the substrate. For instance, substrate holder 24 is shown connected to a motor 32 which in turn is connected with a power source 34. The motor may be configured to rotate the substrate holder (as illustrated by arrow 33) when powered by the source 34. The rotation of the substrate holder rotates substrate 26. Rotation of substrate 26 may enable more uniform treatment of an upper source of the substrate than would be achieved without rotation. Also, nozzle 28 is shown coupled to a motor 36, which in turn is coupled to a power source/control unit 38. The motor 36 may be utilized for moving the nozzle 28 laterally within the chamber (as illustrated by arrows 35 and 37) which, in combination with rotation of substrate 26, may enable the nozzle to be utilized for treatment of the entire surface of substrate 26.

Apparatus 10 comprises a temperature control system 100 provided proximate the chamber. The temperature control system may comprise, for example, one or both of a condenser and a heater, and may be utilized for changing or maintaining temperature within the chamber. The temperature control system 100 may be entirely external to the chamber, as shown, or may have portions (not shown) extending within the chamber.

The temperature control system 100 and pump 20 may each be considered to be a condition changing system provided proximate the chamber. Specifically, the temperature control system and/or pump may be utilized to change one or both of temperature and pressure within the chamber. The change in temperature and/or pressure can change physical properties of the aerosol droplets 30, which may, for example, enhance evaporation of the liquid carrier of the dispersion. In some embodiments, nozzle 28 is an electrohydrodynamic atomization nozzle, and the pressure within chamber 14 is maintained at sub-atmospheric during formation of the aerosol with the nozzle.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

What is claimed is:

1. A method for treating a semiconductor substrate surface, comprising:
dispersing beads in liquid carrier;
passing the beads and liquid carrier through an aerosol-forming nozzle to form aerosol droplets comprising the beads encapsulated in the liquid carrier;
forming a transfer layer over the semiconductor substrate surface;

directing the aerosol droplets toward the transfer layer and impacting the transfer layer with the beads of the aerosol droplets; force of the impacting transferring through the transfer layer to the semiconductor substrate surface; and wherein the liquid carrier consists of one or more compositions that volatilize during the directing of the droplets to the transfer layer so that only the beads from the droplets remain to impact the transfer layer.

2. The method of claim 1 wherein the liquid carrier comprises one or more of methanol, ethanol, propanol, butanol, acetone and isopropyl alcohol.

* * * * *